United States Patent
Ohtani

(10) Patent No.: US 9,614,345 B2
(45) Date of Patent: Apr. 4, 2017

(54) ARRAYED OPTICAL AMPLIFIER AND OPTICAL TRANSMISSION DEVICE

(71) Applicant: FUJITSU LIMITED, Kawasaki-shi, Kanagawa (JP)

(72) Inventor: Toshihiro Ohtani, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/953,872

(22) Filed: Nov. 30, 2015

(65) Prior Publication Data

US 2016/0211641 A1 Jul. 21, 2016

(30) Foreign Application Priority Data

Jan. 20, 2015 (JP) .................. 2015-008749

(51) Int. Cl.
| | | |
|---|---|---|
| *H01S 3/10* | (2006.01) | |
| *H01S 3/067* | (2006.01) | |
| *H01S 3/13* | (2006.01) | |
| *H04J 14/02* | (2006.01) | |
| *H01S 3/23* | (2006.01) | |
| *H04B 10/291* | (2013.01) | |
| *H04B 10/572* | (2013.01) | |
| *H01S 3/04* | (2006.01) | |

(52) U.S. Cl.
CPC ....... *H01S 3/10015* (2013.01); *H04B 10/291* (2013.01); *H04B 10/572* (2013.01); *H04J 14/0212* (2013.01); *H01S 3/04* (2013.01); *H01S 3/06704* (2013.01); *H01S 3/1301* (2013.01); *H01S 3/2383* (2013.01)

(58) Field of Classification Search
CPC ..... H01S 3/1317; H01S 3/2308; H01S 5/4025
See application file for complete search history.

(56) References Cited

U.S. PATENT DOCUMENTS

| | | | | |
|---|---|---|---|---|
| 6,134,036 A | * | 10/2000 | Andreozzi | H04J 14/0212 385/17 |
| 9,368,941 B1 | * | 6/2016 | Dashti | H01S 5/4087 |
| 2002/0131164 A1 | * | 9/2002 | Palese | H01S 3/2383 359/349 |
| 2003/0072343 A1 | * | 4/2003 | Murray | H01S 3/0627 372/50.1 |
| 2008/0316479 A1 | * | 12/2008 | Suzuki | G02B 6/12019 356/300 |
| 2009/0028562 A1 | * | 1/2009 | Gianordoli | H04B 10/29 398/61 |
| 2010/0150551 A1 | * | 6/2010 | Yamahara | H04J 14/0212 398/34 |
| 2014/0139906 A1 | * | 5/2014 | Takeyama | H01S 3/06758 359/337.13 |

(Continued)

FOREIGN PATENT DOCUMENTS

JP 2000-031575 1/2000

*Primary Examiner* — Eric Bolda
(74) *Attorney, Agent, or Firm* — Fujitsu Patent Center

(57) ABSTRACT

An arrayed optical amplifier includes: at least one first amplifier including a first excitation light source controlled to a first temperature; at least one second amplifier including a second excitation light source controlled to a second temperature different from the first temperature; and a control circuit coupled to the at least one first amplifier and the at least one second amplifiers.

16 Claims, 11 Drawing Sheets

(56) References Cited

U.S. PATENT DOCUMENTS

2014/0241726 A1* 8/2014 Ho .................... H01S 3/04
                                              398/70
2016/0043799 A1* 2/2016 Zheng ............ H04B 10/07955
                                              398/38

* cited by examiner

| AMBIENT TEMPERATURE | LD CONTROLLED TO 25°C | LD CONTROLLED TO 45°C |
|---|---|---|
| 0~15°C | MEDIUM PELTIER CURRENT | LARGE PELTIER CURRENT |
| 15~35°C | SMALL PELTIER CURRENT | MEDIUM PELTIER CURRENT |
| 35~55°C | MEDIUM PELTIER CURRENT | SMALL PELTIER CURRENT |
| 55~70°C | LARGE PELTIER CURRENT | MEDIUM PELTIER CURRENT |

ARRAYED OPTICAL AMPLIFIER AND OPTICAL TRANSMISSION DEVICE

CROSS-REFERENCE TO RELATED APPLICATION

This application is based upon and claims the benefit of priority of the prior Japanese Patent Application No. 2015-008749, filed on Jan. 20, 2015, the entire contents of which are incorporated herein by reference.

FIELD

The embodiments discussed herein are related to an arrayed optical amplifier and an optical transmission device.

BACKGROUND

An optical transmission device that supports a reconfigurable optical add/drop multiplexer (ROADM) function uses a wavelength selectable switch (WSS) that adds (inserts)/drops (branches) signals of arbitrary wavelengths.

A related technology is disclosed in Japanese Laid-open Patent Publication No. 2000-31575.

SUMMARY

According to an aspect of the embodiments, an arrayed optical amplifier includes: at least one first amplifier including a first excitation light source controlled to a first temperature; at least one second amplifier including a second excitation light source controlled to a second temperature different from the first temperature; and a control circuit coupled to the at least one first amplifier and the at least one second amplifiers.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

For example, as optical communication networks become complicated and have higher functionality, WSSs having an even larger number of ports and multicast switches (MCSs) that allocate an identical signal to a large number of ports are used as optical parts.

Because of a large optical loss of a WSS or an MCS, an optical signal that has passed through the WSS or the MCS as an optical part may not satisfy an allowable dynamic range of an optical part as a next input destination. In order to compensate for a decrease in optical level due to the optical loss and obtain a desired optical level, an optical amplifier is arranged for each of add and drop ports.

Figure 1:
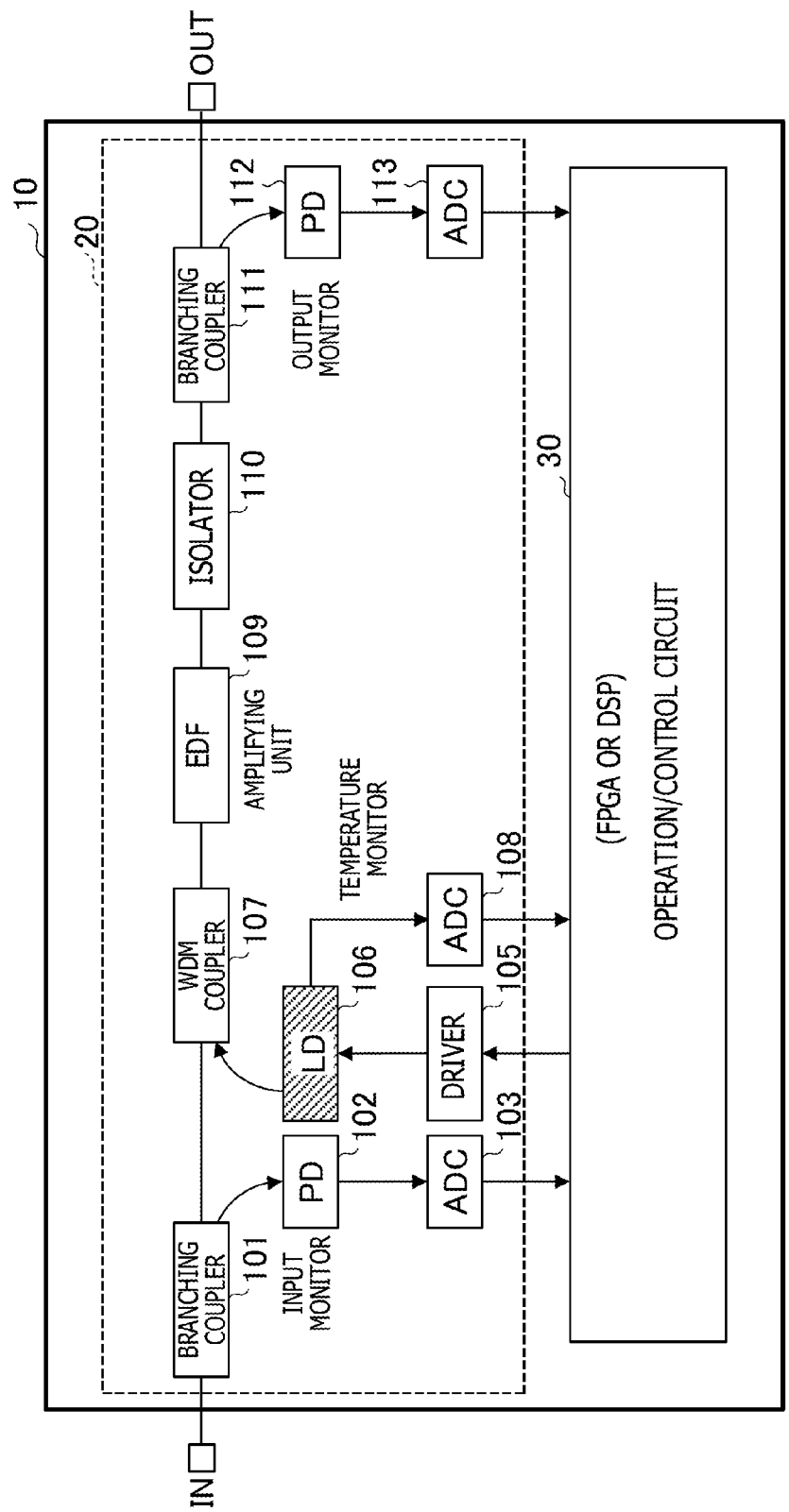
FIG. 1 illustrates an example of an optical amplification module.

FIG. 1 illustrates an example of an optical amplification module. An amplifying unit 20 is mounted within one optical amplification module 10 together with an operation/control circuit 30 such as a field programmable grid array (FPGA), a digital signal processor (DSP), or the like. In the amplifying unit 20, input signal light is multiplexed with light from an excitation LD 106 in a wavelength division multiplexing (WDM) coupler 107, and is then amplified by an erbium-doped fiber (EDF) 109. The signal light amplified by the EDF 109 is output through an isolator 110. A part of the input signal light is branched by a branching coupler 101, monitored by a photodiode (PD) 102 on an input side, converted into a digital form by an analog-to-digital converter (ADC) 103, and then input to the operation/control circuit 30. A part of the light amplified by the EDF 109 is branched by a branching coupler 111 on an output side, monitored by a PD 112 on the output side, converted into a digital form by an ADC 113, and then input to the operation/control circuit 30. The operation/control circuit 30 calculates the amplification gain of the EDF 109 by comparing an input monitor value and an output monitor value with each other, and adjusts a current injected into the LD 106 so that the amplification gain becomes a desired value. The excitation LD 106 is thereby driven by a driver 105 so as to operate with a given output optical power.

Figure 2:
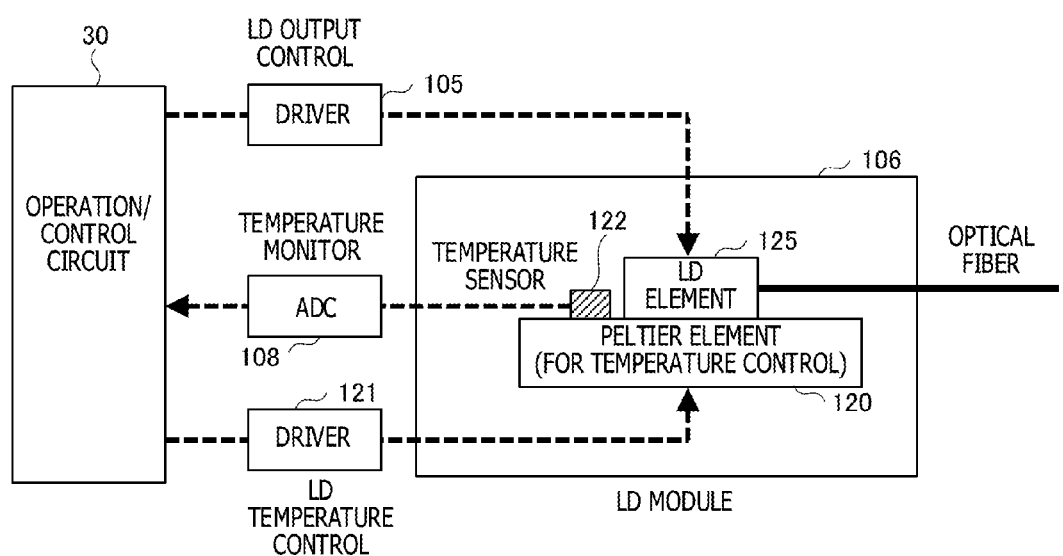
FIG. 2 illustrates an example of control of a temperature of a laser diode (LD) element.

Changes in the wavelength of the LD 106 due to temperature changes affect the amplification characteristics of the optical amplification module 10. The temperature of the excitation LD 106 is therefore controlled to be a substantially constant temperature. FIG. 2 illustrates an example of control of a temperature of an LD element. A thermistor (temperature sensor) 122 disposed in proximity to an LD element 125 monitors the temperature of the LD element 125. An amount of current injected into a Peltier element 120 as a temperature adjusting element is controlled so as to make the temperature of the LD element 125 substantially constant. The output of the temperature sensor 122 is converted into a digital form by an ADC 108 as a temperature monitor, and then input to the operation/control circuit 30 to control the amount of the injected current by a driver 121.

For example, a plurality of LD elements as well as a plurality of PDs and a plurality of thermistors corresponding to each of the plurality of LD elements are mounted on a single electronic cooling element.

The larger the amount of the current into the Peltier element 120, the higher the ability to change the temperature. A direction in which the current is made to flow in the Peltier element 120 can be changed to control the raising and lowering of the temperature. In the excitation LD 106, two currents, which are a current injected into the LD element 125 to output light and a current injected into the Peltier element 120 to make the temperature substantially constant, are used, and may both be a factor in generating heat.

Due to complication of optical transmission devices which complication is attendant on complication of transmission networks, a configuration is also assumed in which a large number of optical amplifiers are arranged in the form of an array. Thus, a driving current for temperature control and an amount of heat generation may be increased.

When a plurality of optical amplifiers are used, the larger a difference between the controlled temperature of excitation LDs and an ambient temperature, the larger an amount of current supplied to Peltier elements. The use of two or more kinds of excitation lasers different from each other in the controlled temperature, for example different from each other in temperature when outputting specific wavelength light may decrease a maximum value of the driving current for controlling the Peltier elements over a usage temperature range.

Figure 3:
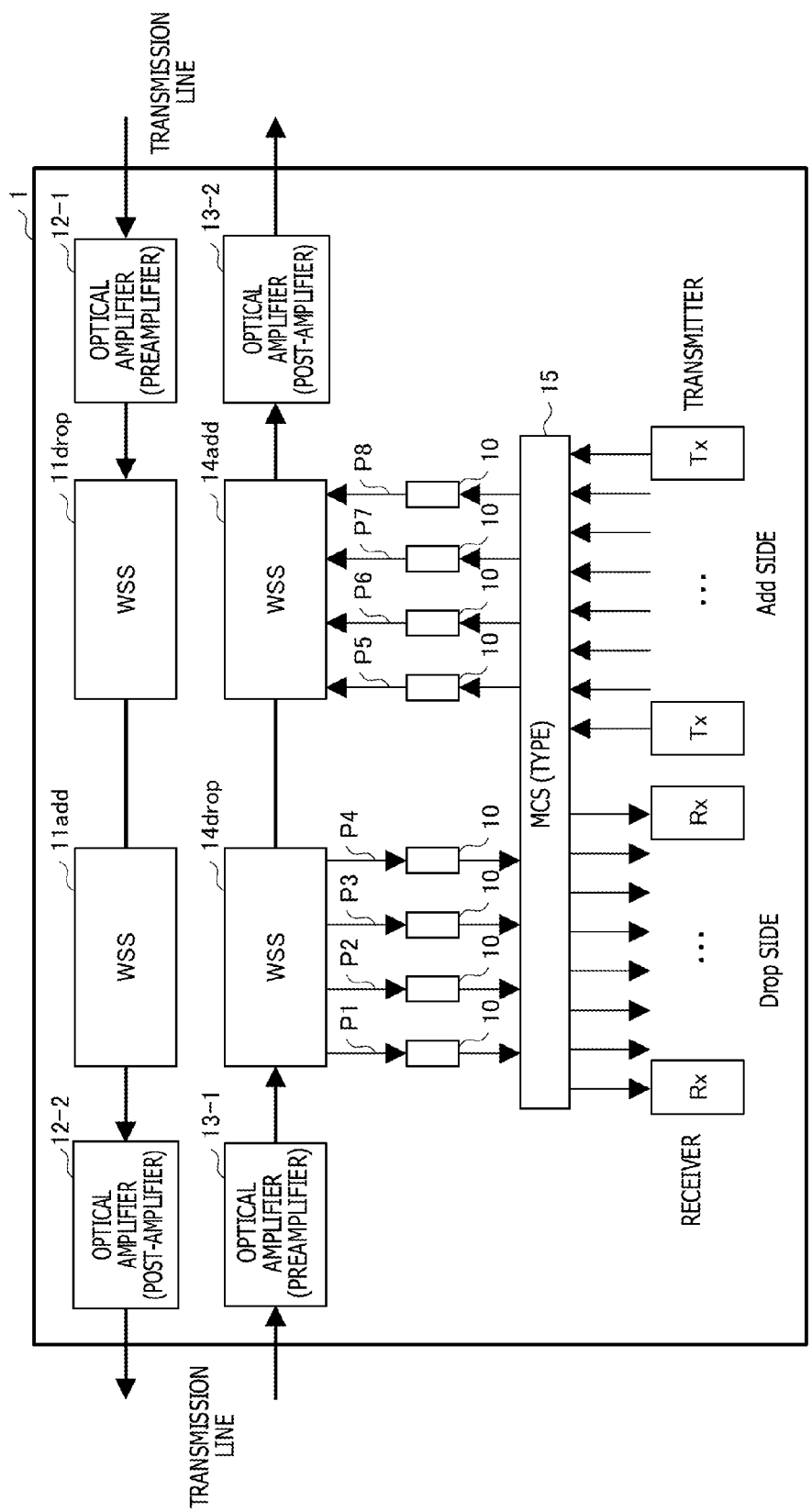
FIG. 3 illustrates an example of an optical transmission device.
Figure 4:
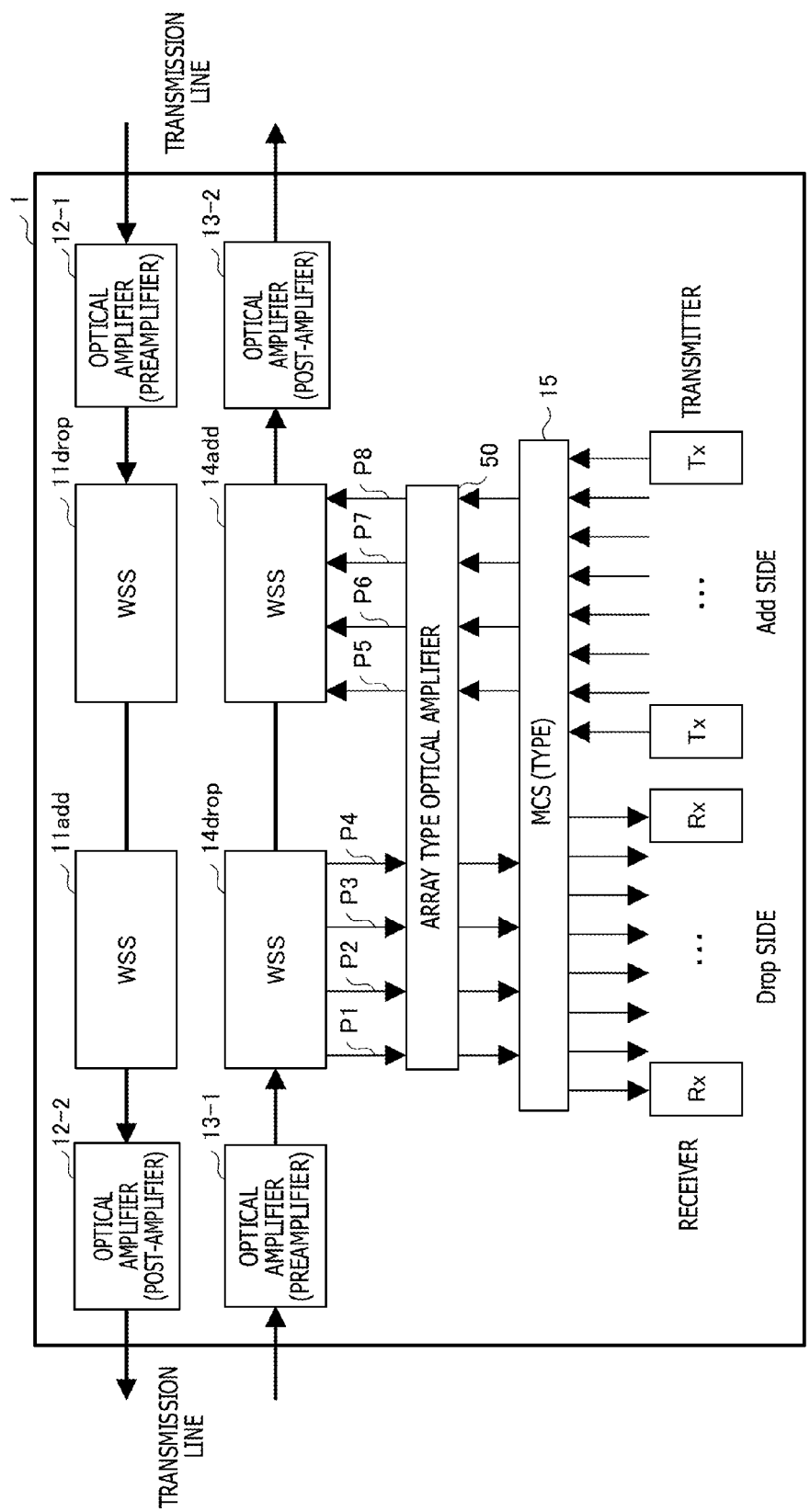
FIG. 4 illustrates an example of an optical transmission device.
Figure 5:
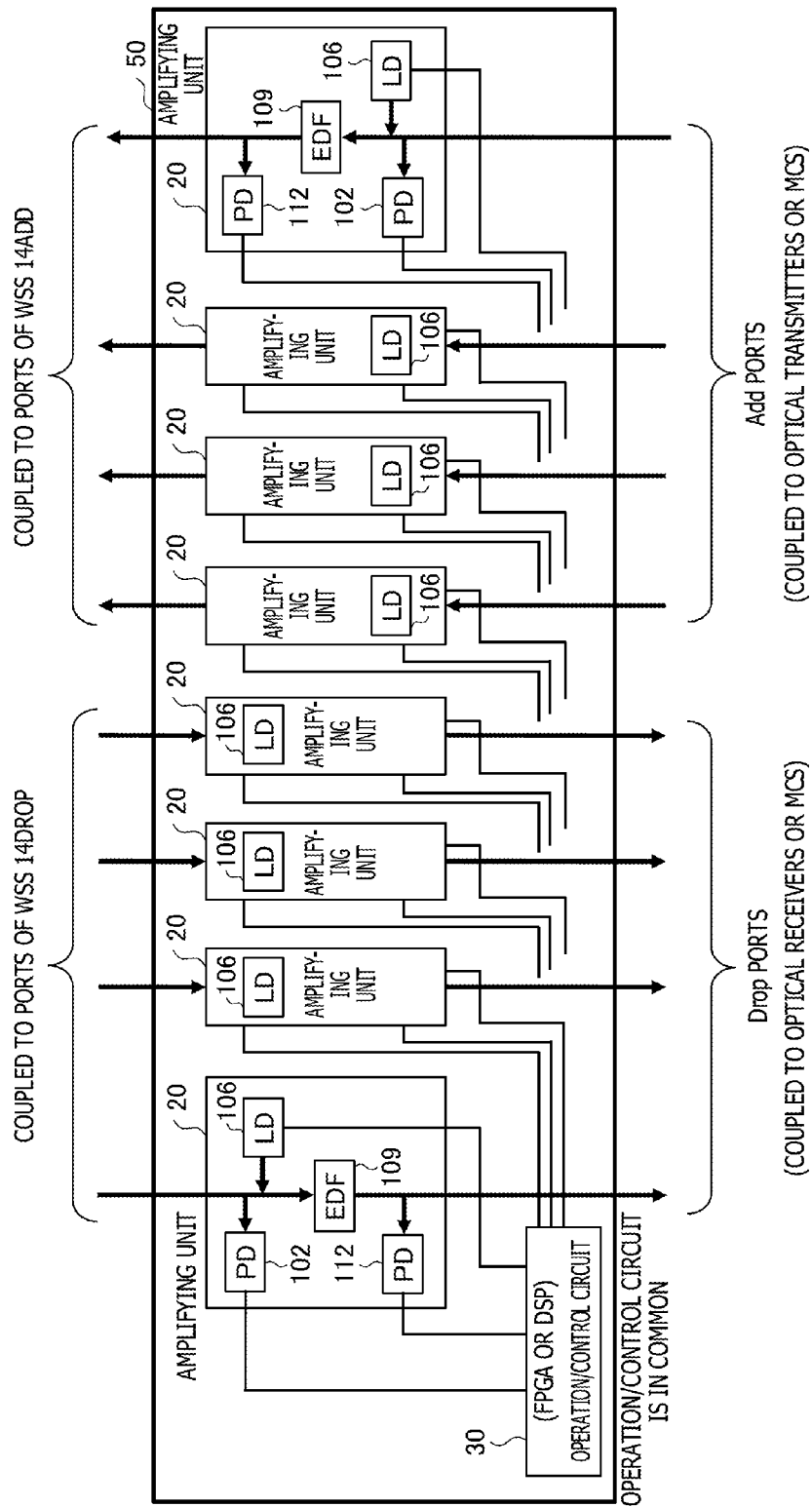
FIG. 5 illustrates an example of an array type optical amplifier.

FIG. 3 illustrates an example of an optical transmission device. FIG. 4 illustrates an example of an optical transmission device. FIG. 5 illustrates an example of an array type optical amplifier. An optical transmission device 1 illustrated in FIG. 3 relays optical signals between a transmission line on the left side of the figure and a transmission line on the right side of the figure. For convenience of illustration, however, description will be of couplings for a transmission route from the transmission line on the left side to the transmission line on the right side. The optical transmission device 1 includes: an optical amplifier (preamplifier) 13-1 that amplifies the optical signal input from the transmission line on the left side; an optical amplifier (post-amplifier) 13-2 that amplifies the optical signal to be output to the transmission line on the right side; a WSS 14add that inserts signals of arbitrary wavelengths on an add side; and a WSS 14drop that branches signals of arbitrary wavelengths on a drop side (the WSSs may hereinafter be referred to collectively as a "WSS 14" as appropriate). Also for a transmission route from the transmission line on the right side to the transmission line on the left side, the optical transmission device 1 includes an optical amplifier (preamplifier) 12-1, an optical amplifier (post-amplifier) 12-2, a WSS 11add, and a WSS 11drop (the WSSs may hereinafter be referred to collectively as a "WSS 11" as appropriate). The WSS 11drop branches signals of arbitrary wavelengths, and sends the signals to a receiver side. The WSS 11add inserts signals of arbitrary wavelengths from a transmitter side, and outputs the signals to the transmission line on the left side. The optical transmission device 1 may include an MCS 15 that allocates an identical signal to a plurality of ports. On the drop side, an optical coupler and an optical selector may be used in place of the WSS 11drop and the WSS 14drop. On the add side, an optical coupler may be used in place of the WSS 11add and the WSS 14add.

Because the WSSs 11 and 14 and the MCS 15 cause a large optical loss, an optical amplification module 10 may be arranged for each of ports P5 to P8 on the add side and ports P1 to P4 on the drop side to compensate for a decrease in optical level. A desired optical level may be thereby obtained.

Incorporating the optical amplification module 10 into each of the large number of ports as illustrated in FIG. 3, for example, may be physically difficult to realize. Therefore, as illustrated in FIG. 4 and FIG. 5, for example, a operation/control circuit 30 is used in common, and an array type amplifier 50 (that may hereinafter be referred to as an "amplifier array 50") including a plurality of amplifying units 20 housed in one casing or mounted on one substrate may be used.

In FIG. 4, the arrayed optical amplifier 50 shared by all of the ports P5 to P8 on the add side and the ports P1 to P4 on the drop side is inserted between the MCS 15 and the WSSs 14 and 11. For convenience of illustration, coupling lines between the WSS 11 and the array type optical amplifier 50 and the MCS 15 may be omitted. As illustrated in FIG. 5, the plurality of amplifying units 20 used in the arrayed optical amplifier 50 amplify optical signals that are inserted and/or branched through the respective ports, and may be differentiated from the optical amplifiers 12-1, 12-2, 13-1, and 13-2 used for transmission and reception between the optical transmission device 1 and the transmission lines.

The arrayed optical amplifier 50 in FIG. 5 is used in the optical transmission device 1. The plurality of amplifying units 20 are arranged so as to correspond to the respective ports on the add side and the drop side. A detailed constitution may be omitted for convenience of illustration. The plurality of amplifying units 20 may include a substantially identical or similar configuration, and the configuration may be similar to that of the amplifying unit 20 illustrated in FIG. 1. In each of the amplifying units 20, the monitor output of a PD 102 on an input side and the monitor output of a PD 112 on an output side, the PD 112 being disposed in a stage subsequent to an EDF 109, are input to the operation/control circuit 30 in common.

Each of the amplifying units 20 includes an LD 106 as an excitation light source. The excitation LD includes two kinds of LDs, for example, an LD in a 980-nm band and an LD in a 1480-nm band. An LD in the 980-nm band which causes less noise from amplified spontaneous emission (ASE) and is provided at low cost, for example, may be used. The oscillation wavelength of a semiconductor LD changes when an index of refraction within the element changes due to a temperature change. Simultaneously with the change in the oscillation wavelength, quantum efficiency, for example a rate of converting an injected current into optical output changes, so that the optical output is changed. For example, when the temperature rises, the wavelength shifts to a longer wavelength side, and the output changes in a decreasing direction.

In FIG. 5, eight sets of amplifying units 20 are mounted, each of the amplifying units 20 including an excitation LD 106, an EDF 109, an input monitoring PD 102, and an output monitoring PD 112. As illustrated in FIG. 2, the LD 106 includes an LD element 125 and a temperature control element (Peltier element) 120. The array may include a constitution having a size (volume) eight times that of one amplifying unit 20, or may include a constitution housing the eight amplifying units 20 within a volume smaller than the volume obtained by the simple multiplication. In that case, heat generated from a plurality of LDs 106, for example the eight LDs 106 within the smaller volume may be considered.

Figure 6:
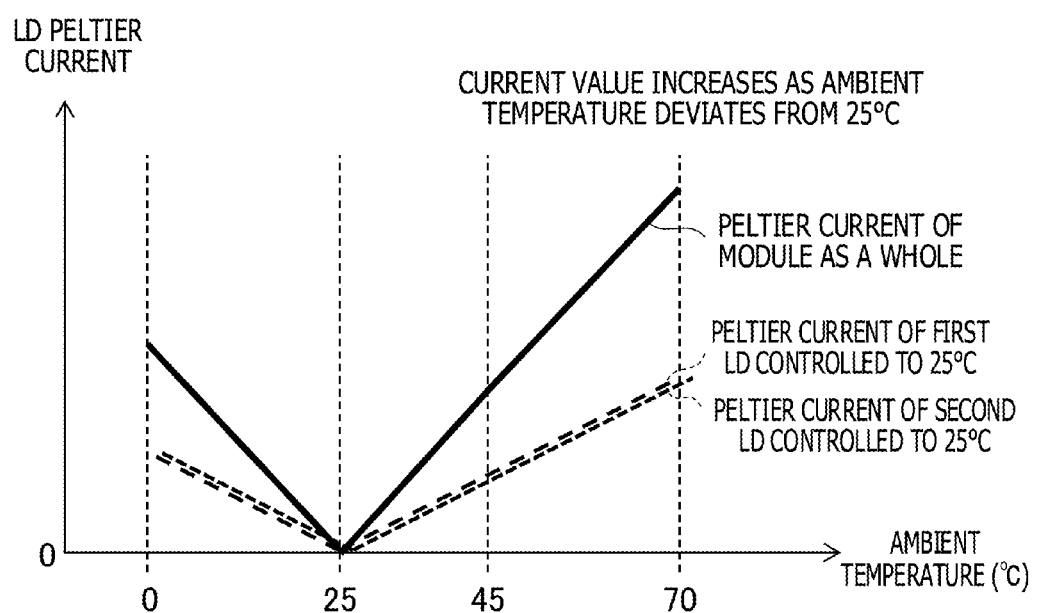
FIG. 6 illustrates an example of relation between an ambient temperature and Peltier current.

FIG. 6 illustrates an example of relation between an ambient temperature and Peltier current. As an example, a plurality of LDs 106 are simply arranged. As an example, the excitation LD 106 may be controlled so as to maintain a temperature of 25° C. in order to make the oscillation wavelength substantially constant. When the ambient temperature rises, the Peltier element 120 (see FIG. 2) consumes a larger amount of current to lower the temperature of the LD 106. When the ambient temperature falls, the Peltier element 120 consumes more current to raise the temperature of the LD 106 to 25° C.

As illustrated in FIG. 6, when the ambient temperature is 25° C., no current needs to be fed to the Peltier element 120, and thus an amount of current for temperature control is nearly zero. However, as a difference between the controlled temperature of the LD 106 and the ambient temperature becomes higher, the amount of current supplied to the Peltier element 120 is increased. When the ambient environment is in higher temperature or lower temperature, power consumption in each LD 106, for example the amount of current supplied to the Peltier element 120 is increased. When the eight LDs 106 are arranged simply, the amount of current to be supplied to the Peltier elements 120 (see FIG. 2) increases eightfold as the ambient temperature changes. Thus an increase in power consumption of the arrayed optical amplifier 50 as a whole becomes more noticeable. In this case, a high-capacity current source may be needed to secure the large amount of current, and an amount of heat generated by the current supplied to the Peltier elements 120 may be increased.

Figure 7:
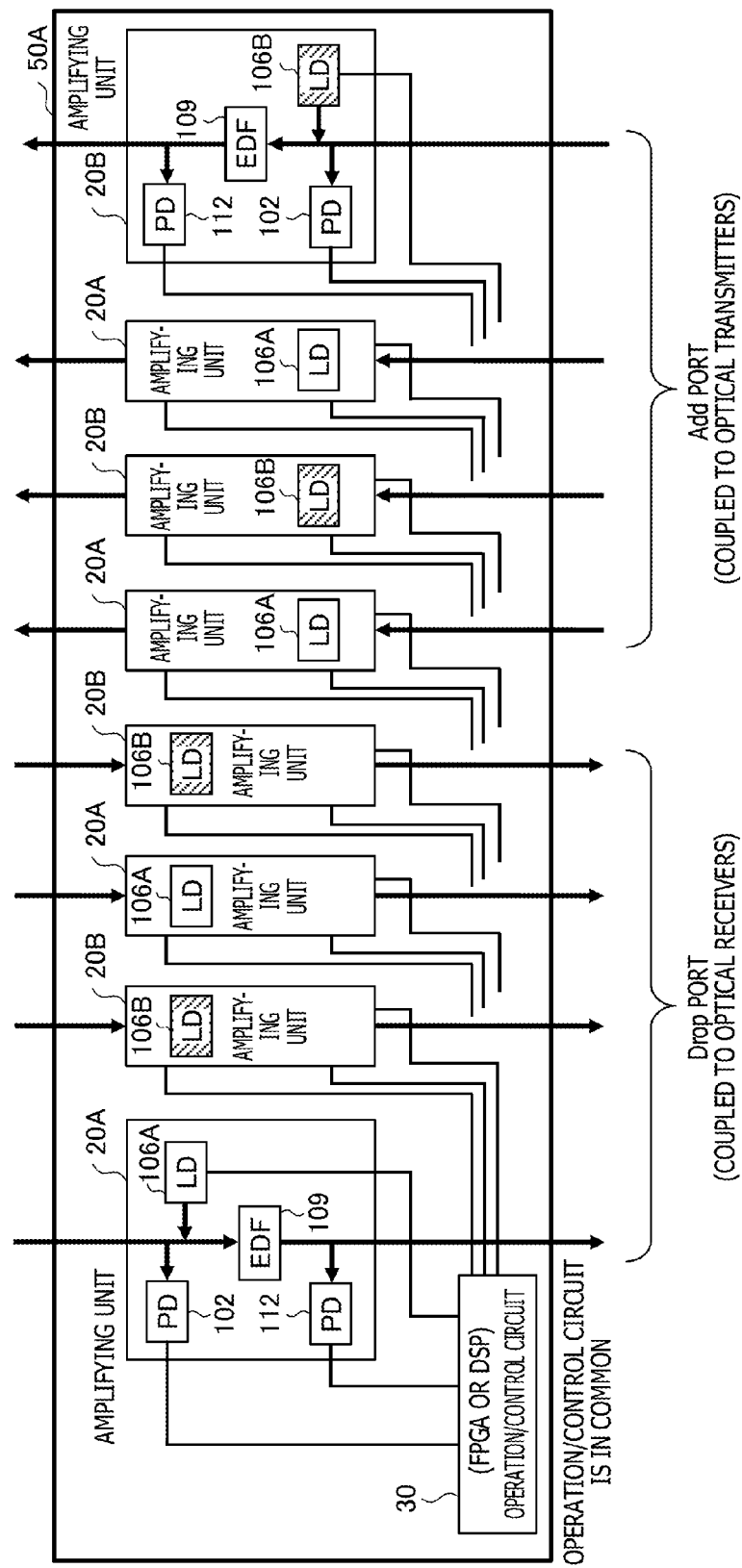
FIG. 7 illustrates an example of an arrayed optical amplifier.

Therefore, a constitution for reducing an increase in power consumption of an arrayed optical amplifier as a whole using a plurality of amplifiers may be provided. FIG. 7 illustrates an example of an arrayed optical amplifier. An arrangement configuration of an arrayed optical amplifier 50A is illustrated in FIG. 7. In the arrayed optical amplifier 50A of FIG. 7, two kinds of LDs 106A and 106B controlled to different temperatures are arranged alternately. Excitation LD elements 125 (see FIG. 2) of the LDs 106A may be controlled to a substantially constant temperature of 25° C., for example. Excitation LD elements 125 of the LDs 106B may be controlled to a substantially constant temperature of 45° C., for example. Controlling the temperature of the LD elements 125 reduces changes in oscillation characteristics which are caused by changes in the temperature of the ambient environment. Heat generated from the LDs 106 themselves and heat generated from the operation/control circuit 30 and other electric and electronic parts within the arrayed optical amplifier 50A may cause the ambient temperature to become higher temperature exceeding 45° C. For example, depending on a place of usage and a season, the ambient temperature may become lower than 25° C. When the LDs 106A controlled to 25° C. and the LDs 106B controlled to 45° C. are mounted in a mixed manner, for example, an increase in amount of current supplied for temperature control in regions where the ambient temperature deviates from the controlled temperature is reduced. As a result, the power consumption of the arrayed optical amplifier 50A as a whole is reduced.

Figures 8A, 8B:
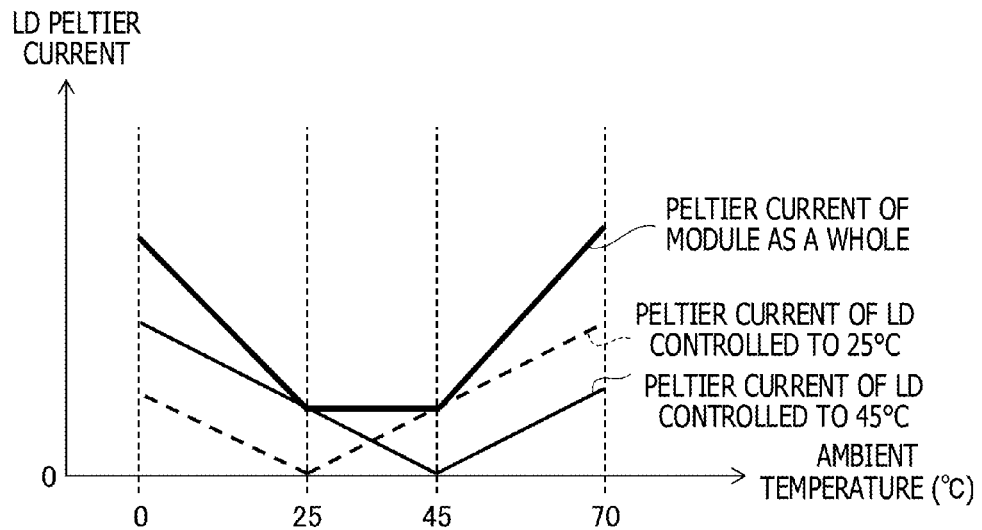
FIG. 8A and FIG. 8B illustrate an example of relation between an ambient temperature and Peltier current.

FIG. 8A and FIG. 8B illustrate an example of relation between an ambient temperature and Peltier current. In FIG. 8A, the Peltier current of the LD 106A controlled to 25° C. is represented by a broken line, the Peltier current of the LD 106B controlled to 45° C. is represented by a solid line, and the Peltier current of the module as a whole is represented by a thick line. The Peltier current of the LD 106A controlled to 25° C. increases in both of a case where the ambient temperature becomes lower than 25° C. as a boundary and a case where the ambient temperature becomes higher than 25° C. as the boundary. The amount of Peltier current of the LD 106B controlled to 45° C. increases in both of a case where the ambient temperature becomes lower than 45° C. as a boundary and a case where the ambient temperature becomes higher than 45° C. as the boundary. The mixing of the LDs 106A and the LDs 106B having different controlled temperatures reduces amounts of Peltier current in a high temperature region and a low temperature region that are away from the controlled temperatures. For example, a maximum value of a total amount of driving current supplied to the Peltier elements 120 is decreased, and the amount of Peltier current is leveled off over the whole of environment temperatures, so that the amount of current is reduced.

As illustrated in FIG. 8B, the Peltier current of the LD 106A controlled to 25° C. becomes largest in a high temperature region in which the ambient temperature is 55° C. to 70° C., and the Peltier current of the LD 106B controlled to 45° C. becomes largest in a low temperature region in which the ambient temperature is 0° C. to 15° C. In the whole of the module or the arrayed optical amplifier 50A, as illustrated in FIG. 8A, the amount of Peltier current when the ambient temperature is between 25° C. to 45° C. is a substantially constant amount, and the Peltier current changes at a gentle rate (slope) when the ambient temperature is higher than 45° C. or lower than 25° C. The Peltier current in a middle temperature range is leveled off, and an extreme increase in the current in the low temperature region and the high temperature region that are away from the controlled temperatures is reduced. As an example, the temperature within the arrayed optical amplifier 50 during the use of the optical transmission device 1 tends to be a high temperature, and therefore as compared with FIG. 6, an effect of reducing power consumption during high temperatures is expected.

In FIG. 7, the LDs 106A controlled to 25° C. and the LDs 106B controlled to 45° C. are arranged alternately. Amounts of heat generated from the Peltier elements 120 in the respective LDs 106 are thereby dispersed and leveled off. Irrespective of the add side and the drop side, the LDs 106A and the LDs 106B having different controlled temperatures are used in ports adjacent to each other. As an example, optical characteristics realized on the add side and the drop side, for example input levels and output levels may be different, and therefore output powers desired to the excitation LD elements 125 being used may be different. As an example, ports on the add side and ports on the drop side are arranged alternately, and the LDs 106 having different controlled temperatures are arranged in ports adjacent to each other and having different functions. This configuration decreases a maximum value of Peltier current that may be necessary for controlling the temperature of the LDs 106, and disperses heat generated from the Peltier elements 120, so that an effect on the optical characteristics is reduced.

Figure 9:
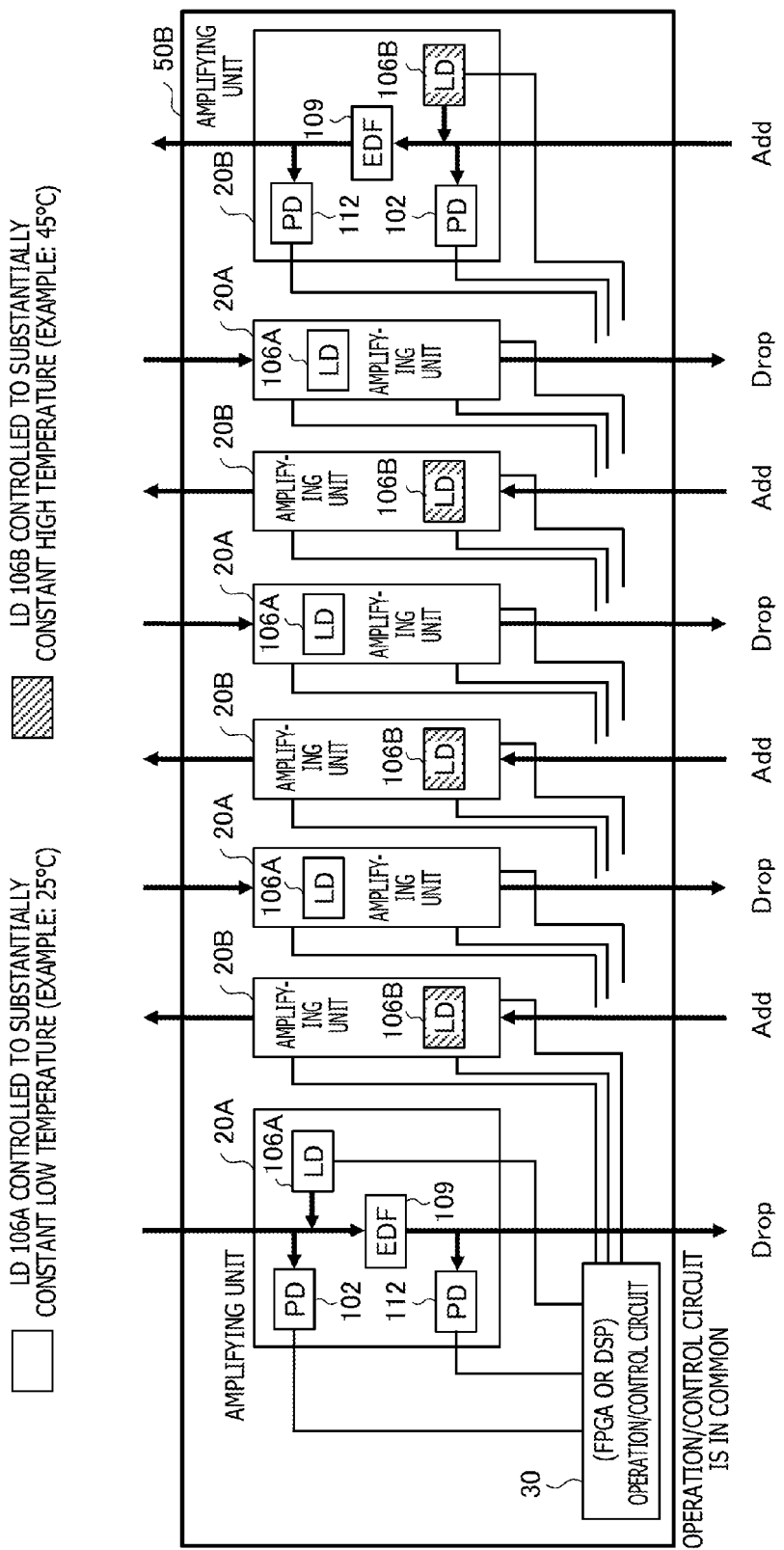
FIG. 9 illustrates an example of an arrayed optical amplifier.

FIG. 9 illustrates an example of an arrayed optical amplifier. In an arrayed optical amplifier 50B of FIG. 9, amplifying units 20B inserted in ports on the add side and amplifying units 20A inserted in ports on the drop side are arranged alternately. Optical signals from respective transmitters (Tx) are input to the amplifying units 20B on the add side, and the outputs of the amplifying units 20A on the drop side are supplied to respective receivers (Rx) (see FIG. 4).

For example, LDs 106A controlled to a temperature of 25° C. are used in the amplifying units 20A on the drop side, and LDs 106B controlled to a temperature of 45° C. are arranged in the amplifying units 20B on the add side. The transmitting side may need high optical output, and the temperature of the amplifying units 20B tends to rise. Thus, the LDs 106B in which the Peltier current to be supplied is minimized at 45° C. may be used on the transmitting side. On the receiving side, optical signals propagated through transmission lines are received. Thus, the LDs 106A and EDFs 109 amplify the input signal light to provide an optimum gain, but excitation energy as high as that on the transmitting side does not need to be used. The LDs 106A in which the Peltier current to be supplied is minimized at 25° C. may therefore be used on the receiving side.

Figure 10:
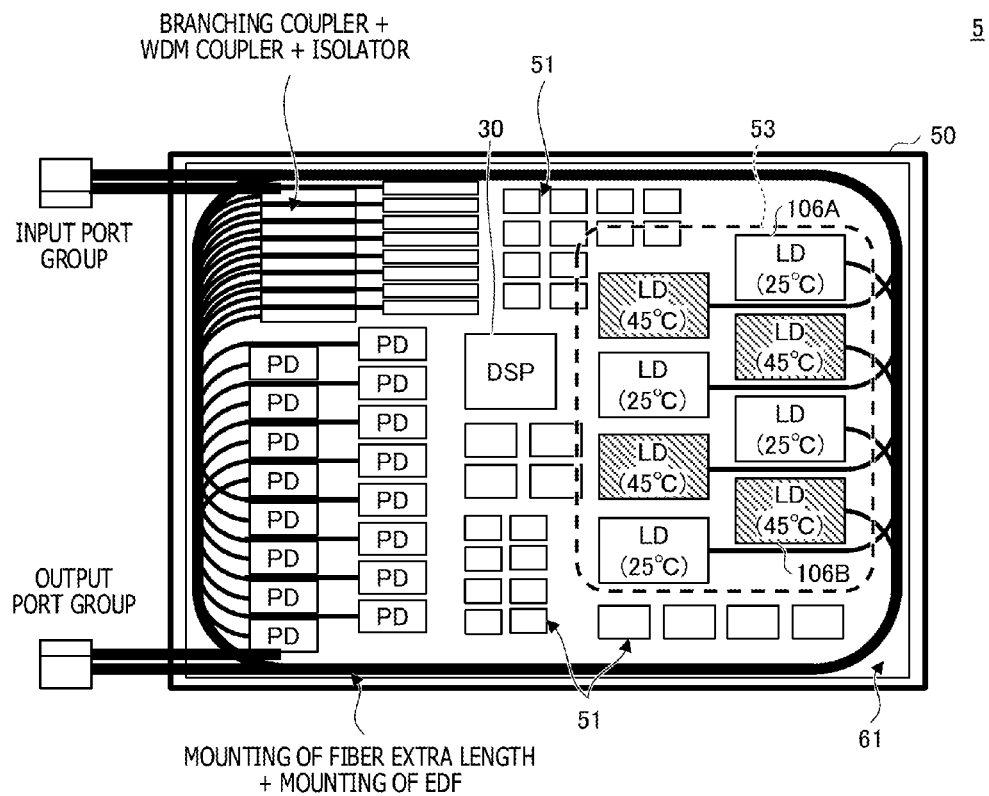
FIG. 10 illustrates an example of an array type optical amplifier module.
Figure 11:
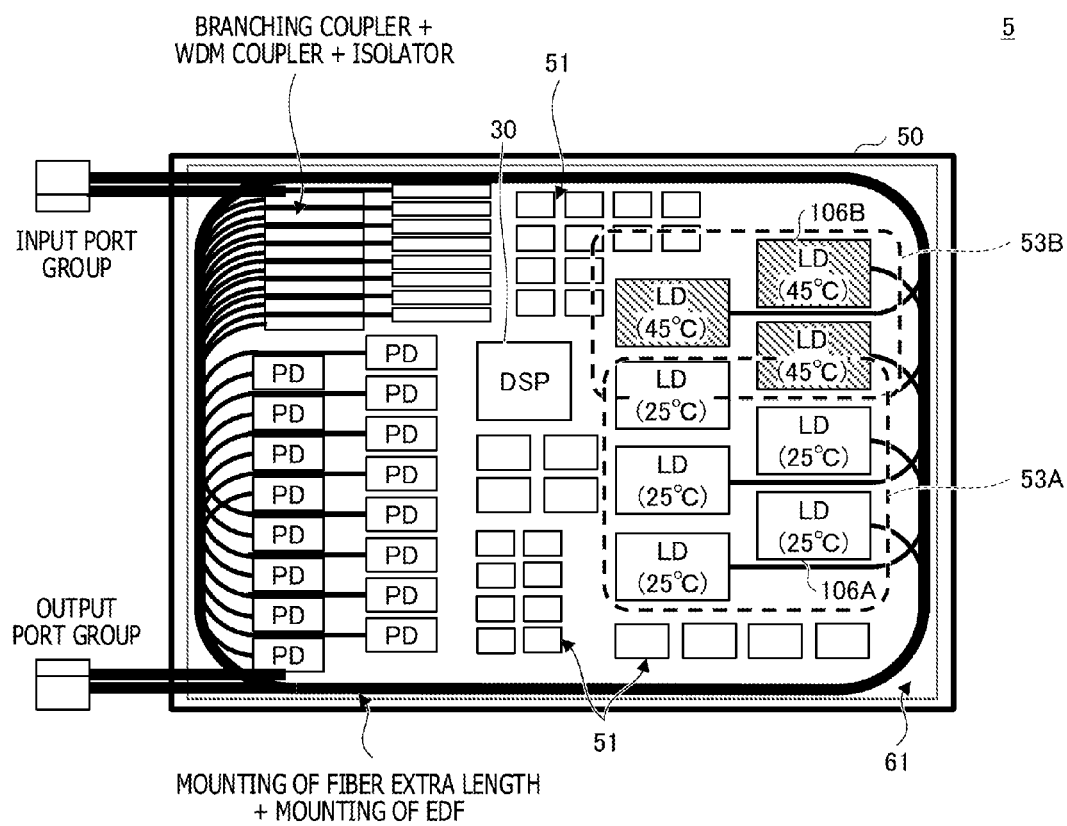
FIG. 11 illustrates an example of an array type optical amplifier module.

The arrangement of the LDs 106A and 106B having different controlled temperatures for the respective functions may decrease a maximum amount of current for driving the Peltier elements 120, and reduce power consumption and an amount of heat generation in the whole of the arrayed optical amplifier 50B, as in FIG. 8. An effect on optical characteristics may also be reduced. FIG. 10 and FIG. 11 each illustrate an example of an array type optical amplifier module. FIG. 10 and FIG. 11 each illustrate an array type optical amplifier module 5 formed by packaging an arrayed optical amplifier 50 within one module. When a plurality of amplifying units 20 are arranged within one module, an amount of heat generation and power consumption may be further reduced. In each of FIG. 10 and FIG. 11, the arrayed optical amplifier 50 may be the arrayed optical amplifier 50A illustrated in FIG. 7, or may be the arrayed optical amplifier 50B illustrated in FIG. 9.

In FIG. 10 and FIG. 11, the same kinds of parts are arranged in the same regions on a printed circuit board 61. A group of PDs as optical parts, for example PDs including input monitoring PDs and output monitoring PDs is arranged in a certain region, and branching couplers, WDM couplers, and isolators are arranged so as to be adjacent to the region in which the PDs are arranged. A DSP 30 and other electric and electronic parts 51 are arranged in respective regions. An extra length part of an optical fiber and an EDF are mounted along the periphery of the printed circuit board 61.

In FIG. 10, LDs 106A and LDs 106B having different controlled temperatures are arranged alternately in an LD arrangement region 53. The dispersed arrangement of the LDs having the same controlled temperature may disperse heat generation, and thus reduce power consumption of the array type optical amplifier module 5 as a whole.

In FIG. 11, LDs 106A having a first controlled temperature (for example 25° C.) are collectively arranged in an LD arrangement region 53A, and LDs 106B having a second controlled temperature (for example 45° C.) are collectively arranged in an LD arrangement region 53B. This arrangement is effective when a temperature difference tends to occur within the array type optical amplifier module 5 due to the internal configuration of the array type optical amplifier module 5 and the arrangement of other parts.

Differences in a heat environment such as the arrangement and mounting configuration of parts within the array type optical amplifier module 5, good or poor heat dissipation, and the like may be obtained in advance from a heat simulation performed at a time of design. The LD arrangement region 53B is set in a position where high temperatures tend to occur, and excitation LDs controlled to a high temperature, for example the LDs 106B controlled to 45° C. are arranged in the LD arrangement region 53B. The LD arrangement region 53A is set in a position where high temperatures do not tend to occur as compared with the LD arrangement region 53B, and excitation LDs controlled to a low temperature, for example the LDs 106A controlled to 25° C. are arranged in the LD arrangement region 53A.

This configuration may decrease a difference between the controlled temperature of each LD and the ambient temperature, and thus reduce power consumption of the array type optical amplifier module 5 as a whole.

Two kinds of excitation LDs 106A and LDs 106B having different controlled temperatures may be used. Similar effects can also be obtained when three or more kinds of excitation LDs are used.

Excitation LDs include not only a type controlled to a substantially constant temperature but also a type that does not need temperature control. An LD that does not need temperature control uses an LD element 125 whose characteristic, for example optical output, exhibits a low rate of change according to temperature changes. The performance of the LD element 125 itself thus has a characteristic of not producing high output. Therefore, in the optical transmission device 1 that adds or drops signals of arbitrary wavelengths, excitation LDs that do not need temperature control may not be applied to the add side that may need high output by optical amplification. Excitation LDs 106 of the type that performs temperature control may be used on the add side, and excitation LDs that do not need temperature control may be used on the drop side where the optical output after optical amplification does not need to be as high as that on the add side. In this case, excitation LDs of the type that performs temperature control and excitation LDs that do not need temperature control may be arranged in a dispersed manner as illustrated in FIG. 10. An amount of current supplied for temperature control is therefore halved. Thus, the power consumption of the array type optical amplifier module 5 as a whole may be reduced, and heat generation may be dispersed.

An arrayed optical amplifier may include a first amplifying unit using an excitation LD controlled to a first temperature, for example 25° C., a second amplifying unit using an excitation LD controlled to a second temperature, for example 45° C., and a third amplifying unit using an excitation LD that does not need temperature control. The first to third amplifying units may be arranged alternately or arranged in a dispersed manner according to a state of arrangement of other parts within the package or a heat distribution. In the array as a whole, a maximum amount of current supplied for temperature control may be reduced, and power consumption may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An arrayed optical amplifier comprising:
    at least one first amplifier including a first excitation light source controlled to a first temperature;
    at least one second amplifier including a second excitation light source controlled to a second temperature different from the first temperature;
    a control circuit coupled to the at least one first amplifier and the at least one second amplifiers;
    a first temperature control element, disposed in the at least one first amplifier, configured to control an operating temperature of the first excitation light source; and
    a second temperature control element, disposed in the at least one second amplifier, configured to control an operating temperature of the second excitation light source.

2. The arrayed optical amplifier according to claim 1, wherein the first temperature control element and the second temperature control element are a Peltier element.

3. The arrayed optical amplifier according to claim 1, wherein the at least one first amplifier includes a first amplifier and third amplifier including the first temperature control element,
wherein a second amplifier of the at least one second amplifier is provided between the first amplifier and the third amplifier.

4. The arrayed optical amplifier according to claim 3, wherein the first amplifier is coupled to an add side port adding an optical signal, and the second amplifier is coupled to a drop side port dropping an optical signal.

5. The arrayed optical amplifier according to claim 2, wherein the at least one first amplifier disposed in a first region are coupled to an add side port adding an optical signal, and the at least one second amplifier disposed in a second region adjacent to the first region are coupled to a drop side port dropping an optical signal.

6. The arrayed optical amplifier according to claim 5, wherein the first excitation light source is disposed within a third region on a board, and the second excitation light source is disposed within a fourth region including a heat distribution different from the third region on the board.

7. The arrayed optical amplifier according to claim 1, further comprising:
a fourth amplifier including a third excitation light source that is not temperature-controlled.

8. An arrayed optical amplifier comprising:
one or more first amplifiers each including a first excitation light source that is temperature-controlled;
one or more second amplifiers each including a second excitation light source that is not temperature-controlled; and
a control circuit coupled to the one or more first amplifiers and the one or more amplifiers.

9. The arrayed optical amplifier according to claim 8, wherein the one or more first amplifiers are collectively arranged in a first region, and the one or more second amplifiers are collectively arranged in a second region adjacent to the first region.

10. An optical transmission device comprising:
an arrayed optical amplifier; and
a wavelength selectable switch coupled to the arrayed optical amplifier,
the arrayed optical amplifier including at least one first amplifier including a first excitation light source controlled to a first temperature, at least one second amplifier including a second excitation light source controlled to a second temperature different from the first temperature, and a control circuit coupled to the at least one first amplifier and the at least one second amplifier,
wherein a first temperature control element, disposed in the at least one first amplifier, is configured to control an operating temperature of the first excitation light source; and a second temperature control element, disposed in the at least one second amplifier, is configured to control an operating temperature of the second excitation light source.

11. The optical transmission device according to claim 10, wherein the first temperature control element and the second temperature control element are a Peltier element.

12. The optical transmission device according to claim 10, wherein the at least one first amplifier includes a includes a first amplifier and a third amplifier including the first temperature control element, and a second amplifier of the at least one second amplifier is provided between the first amplifier and the third amplifier.

13. The optical transmission device according to claim 12, wherein the first amplifier is coupled to an add side port adding an optical signal, and the second amplifier is coupled to a drop side port dropping an optical signal.

14. The optical transmission device according to claim 11, wherein the at least one first amplifier disposed in a first region are coupled to an add side port adding an optical signal, and the at least one second amplifier disposed in a second region adjacent to the first region are coupled to a drop side port dropping an optical signal.

15. The optical transmission device according to claim 14, wherein the first excitation light source is disposed within a third region on a board, and the second excitation light source is disposed within a fourth region including a heat distribution different from the third region on the board.

16. The optical transmission device according to claim 10, further comprising:
a fourth amplifier including a third excitation light source that is not temperature-controlled.

* * * * *